(12) United States Patent
Byrne et al.

(10) Patent No.: US 8,502,098 B1
(45) Date of Patent: Aug. 6, 2013

(54) APPLIANCE CONTROL PANEL

(75) Inventors: Robert M. Byrne, Lima, OH (US); Bret E. Kline, Columbus, OH (US); Steven J. Couvillon, Tipp City, OH (US); Frank J. Catanzarite, Sidney, OH (US)

(73) Assignee: American Trim, LLC, Lima, OH (US)

( * ) Notice: Subject to any disclaimer, the term of this patent is extended or adjusted under 35 U.S.C. 154(b) by 407 days.

(21) Appl. No.: 12/788,759

(22) Filed: May 27, 2010

Related U.S. Application Data

(60) Provisional application No. 61/219,563, filed on Jun. 23, 2009.

(51) Int. Cl.
*H01H 9/00* (2006.01)
*H01H 13/00* (2006.01)
*H01H 19/04* (2006.01)

(52) U.S. Cl.
USPC ............................ 200/296; 200/308; 200/512

(58) Field of Classification Search
USPC .......................................................... 200/296
See application file for complete search history.

(56) References Cited

U.S. PATENT DOCUMENTS

| | | | |
|---|---|---|---|
| 5,399,823 A * | 3/1995 | McCusker | 200/521 |
| 5,500,497 A | 3/1996 | Merriman | |
| 5,747,757 A | 5/1998 | Van Zeeland et al. | |
| 6,137,072 A | 10/2000 | Martter et al. | |
| 6,967,299 B2 * | 11/2005 | Howie et al. | 200/512 |
| 7,498,534 B2 * | 3/2009 | Hoyle | 200/314 |
| 2010/0224469 A1 | 9/2010 | Byrne et al. | |

* cited by examiner

*Primary Examiner* — Renee Luebke
*Assistant Examiner* — Lheiren Mae Caroc
(74) *Attorney, Agent, or Firm* — Rankin, Hill & Clark LLP

(57) ABSTRACT

An appliance control panel is described. The control panel is a laminate assembly of a front metal panel and a rear polymeric film. The film carries various electronic circuits and other components which are operable from the metal panel.

13 Claims, 2 Drawing Sheets

APPLIANCE CONTROL PANEL

CROSS REFERENCES TO RELATED APPLICATIONS

The present application claims priority upon U.S. provisional patent application Ser. No. 61/219,563 filed Jun. 23, 2009.

FIELD OF INVENTION

The present invention relates to a control panel for an appliance such as a washing machine or a dryer.

BACKGROUND OF THE INVENTION

A trend in consumer appliances is to use flex type switches and capacitive switches in the associated appliance control panel(s) for controlling various operations or settings associated with appliance. It is generally not possible to use a front metal face panel in the control panel in conjunction with these switches due to undesirable interaction with the metal. Accordingly, electronic interface style appliance control panels typically utilize a plastic front face panel. Although satisfactory in many regards, control panels having plastic faces are often considered undesirable for use in high end appliances which typically feature brushed and decorated aluminum or stainless steel outer surfaces. Plastic surfaces generally have limited surface decoration characteristics, and in many instances, are considered by consumers as not particularly aesthetically attractive. Accordingly, it would be desirable to provide an appliance control panel that included a metal front face, and yet which could also incorporate electronic interface features using capacitive switches and displays incorporated either flush or proud of the decorated metal surface.

Appliance control panels typically contain a variety of rotary and sliding actuators, push button switches, indicators, and sophisticated circuitry. Traditionally, the actuators, switches, and indicators are mounted on substrates such as printed circuit boards that are enclosed within an apertured enclosure, which as noted is typically plastic. The substrates provide electrical circuits for the various components, i.e. actuators, switches, and indicators. Processing and control functions are typically performed by microprocessors imbedded in this printed circuit board. The entire printed circuit board and enclosure assembly is commonly referred to as a "tech box." Once in electrical connection to the appliance and in mechanical connection to the control panel, the tech box receives inputs from the actuators and switches and controls the operation of the appliance. The tech box may also operate or provide information to various indicators in the control panel.

Although satisfactory in many regards, conventional control panels using tech boxes are complex and thus relatively expensive to manufacture. In addition, tech boxes further add to costs that are eventually reflected in the cost of the appliance. Accordingly, it would be desirable to provide a new type of control panel and one that could be economically manufactured. Furthermore, it would be particularly desirable to provide an appliance control panel that did not require a tech box to therefore achieve further cost savings.

SUMMARY OF THE INVENTION

The difficulties and drawbacks associated with previously known panels and systems are addressed in the present apparatus for an appliance control panel and related method of producing.

In one aspect, the present invention provides a control panel assembly comprising a generally planar metal panel defining a front face and an oppositely directed rear face. The control panel assembly also comprises a generally transparent polymeric film layer disposed along the rear face of the panel. And, the control panel assembly comprises a layer of an adhesive disposed between the panel and the film layer for adhering the film layer to the rear face of the panel. The polymeric film layer includes at least one component selected from the group consisting of an actuator, circuit, indicator, light, switch, processor, and combinations thereof.

In another aspect, the invention provides a method for forming a control panel assembly. The method comprises providing a generally planar metal panel defining a front face and an oppositely directed rear face. The method also comprises providing a polymeric film material defining a front face and an oppositely directed rear face. The method further comprises depositing decorative indicia on the rear face of the film. And, the method comprises depositing functional circuitry on the rear face of the film. Furthermore, the method comprises providing an effective amount of an adhesive. And, the method additionally comprises contacting the front face of the film and the rear face of the metal panel with the adhesive, to thereby form the control panel.

In still another aspect, the present invention provides an appliance utilizing a control panel as described herein.

As will be realized, the invention is capable of other and different embodiments and its several details are capable of modifications in various respects, all without departing from the invention. Accordingly, the drawings and description are to be regarded as illustrative and not restrictive.

DETAILED DESCRIPTION OF THE EMBODIMENTS

Figure 1:
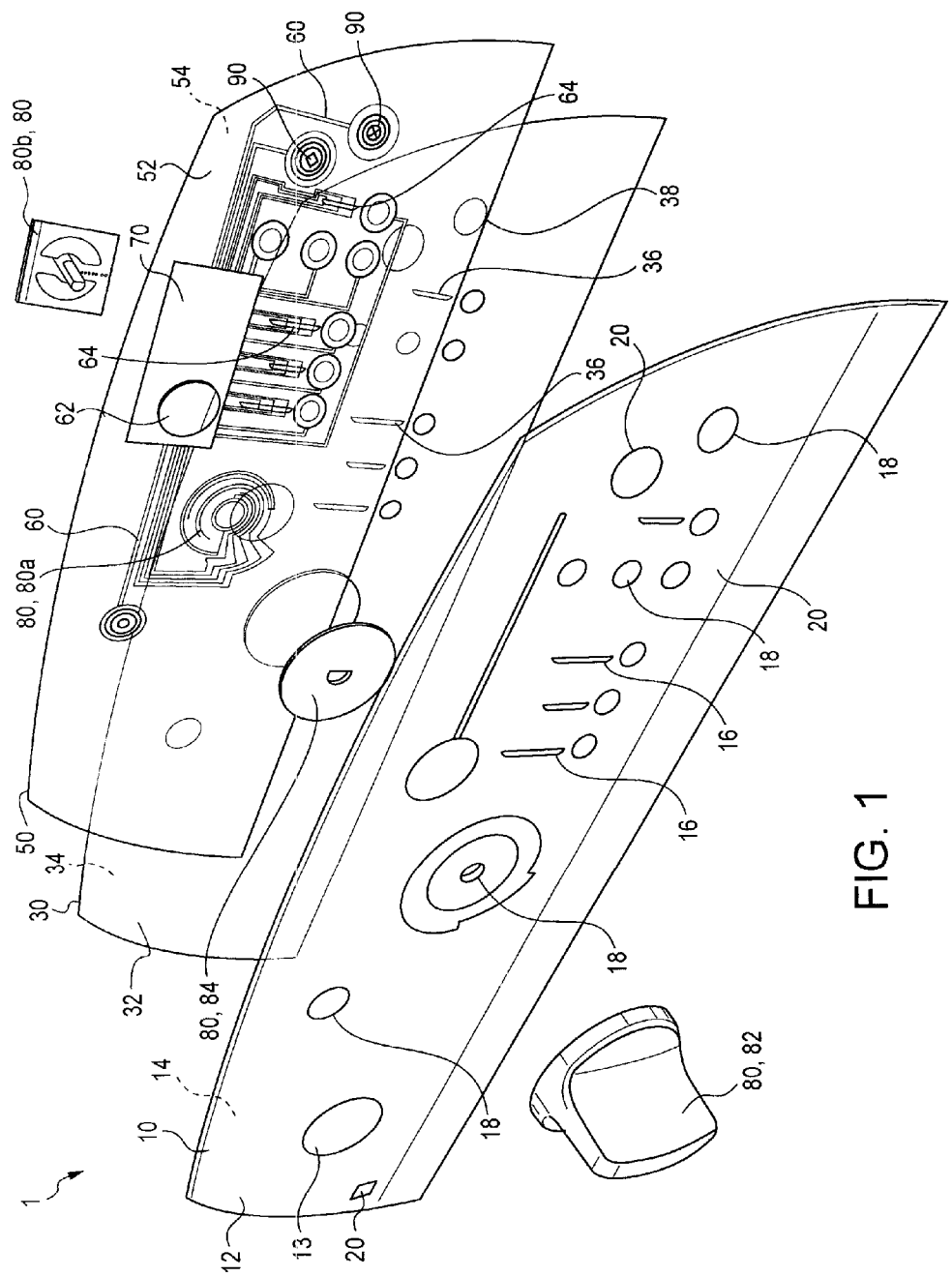
FIG. 1 is an exploded perspective view of a preferred embodiment appliance control panel in accordance with the present invention.

The preferred appliance control panels in accordance with the present invention comprise a metal panel which serves as a front face and support panel and a rearwardly disposed transparent polymeric film layer. A layer of adhesive is preferably disposed between the metal panel and the polymeric film layer. The layer of adhesive is used to adhere the polymeric film layer to a rear face of the metal panel. One or more actuators, electrical and/or optical circuits, indicators, and/or processors are preferably provided on the polymeric film layer. The metal panel provides structural support for the electronic-carrying polymeric film adhered thereto preferably by pressure sensitive adhesive bonding technology. The resulting assembly provides an aesthetic, thin control panel for an appliance. The control panel features a metal front face which is expected to be more favorably perceived by consumers. As all or at least a significant portion of the electronic circuitry is provided on the polymeric film layer, the use of conventional tech boxes can be avoided. The present invention however, includes the new thin control panels that are configured for use with a tech box. The preferred embodiment control panels, their various components and features are all described in greater detail as follows.

Metal Panel

The metal panel is a thin metal panel as typically used in appliance control panels. The panel has a thickness of from about 0.005 inches to about 0.200 inches, and preferably from about 0.010 inches to about 0.100 inches, with 0.020 inches being typically preferred. The panel is typically formed from steel or aluminum. The faces of the panel are generally finished, and may include one or more decorative and/or protective coatings as known in the art. The front face of the panel also typically contains one or more graphics or other indicia. The metal panel may also define one or more cut-outs or apertures for accessing or viewing actuators and indicators along a rearwardly disposed layer, described in greater detail herein. Although the metal panels are typically flat, the panels may include bent or otherwise curved or raised regions.

Polymeric Film

The preferred control panels also comprise one or more layer(s) of polymeric film disposed behind or rearwardly of the metal panel. The polymeric film typically has a thickness of from about 3 mils to about 40 mils, and preferably from about 5 mils to about 20 mils.

The polymeric film may be formed from a wide variety of materials. However, polyesters such as polyethylene terephthalate (PET) materials, or polycarbonate (PC) materials, or blends of these are often preferred. The present invention also includes the use of blends of polyesters for the polymeric film. Polyester is generally preferred due to its excellent resistance to fatigue. However, where applications require a stiffer material or more aggressive formed shapes, polycarbonate or blends of polycarbonate may be preferred. Thin films of these materials are commercially available from numerous sources. Generally, these films are supplied having a variety of surface treatments and optionally containing one or more functional finishes. Preferably, and as described in greater detail herein, a frontwardly directed face and/or a rearwardly face of these films is provided with one or more surface decorative layers and/or a functional finish such as a hardcoat layer as known in the art. Compositions for forming hardcoats are commercially available such as from Tekra Corporation of New Berlin, Wis. It is also contemplated that one or more optional gloss or matte layers can be applied onto select regions of the polymeric film, and preferably along a front face of that film. The rear face of the film receives decoration such as for switches, which can for example include symbols, text, or the like. The rearwardly directed face of the film may also be appropriately surface treated and preferably receives one or more printed circuits and various components such as actuators, indicators, lights, switches and the like as described in greater detail herein.

The polymeric film is transparent, or at least substantially transparent. This feature enables one or more decorative layers deposited along the rear of the film to be viewable through a front face of the film. As described in greater detail, in the assembled control panels, the decorative layers on the rear face of the polymeric layer can thus be seen through apertures formed in the metal panel which preferably overlies the front face of the polymeric film layer.

Adhesive Layer

The preferred control panels also comprise one or more layers or regions of an adhesive layer between the metal panel and the polymeric film. Preferably, the adhesive layer is selectively disposed between a rear face of the metal panel and a forward face of the polymeric film. Preferably, the adhesive is a pressure sensitive adhesive (PSA) layer. Such pressure sensitive adhesives are commercially available, such as from 3M of St. Paul, Minn. under the designation 7555T.

When using a pressure sensitive layer, the adhesive is typically applied onto either the rear face of the metal panel or the front face of the polymeric film. Preferably, the adhesive is applied onto the front face of the polymeric film. A release layer is then applied over the exposed face of the adhesive. Release layers are well known in the art and available from numerous commercial sources. Preferably, the adhesive layer extends over from about 80% to about 90% of the polymeric film. However, the present invention includes layers having greater or lesser degrees of coverage.

It is also contemplated that the pressure sensitive adhesive layer could also be applied as a die cut adhesive layer. Bulk rolls of die cut adhesives are available from a variety of commercial suppliers such as 3M under the designation 486 MP and are die cut to exact patterns by third party web converters.

Methods

The various control panels as described herein are generally formed by obtaining a polymeric film material and printing one or more layers or regions of decorative images, colors, or indicia on a rear face of the film. Next, all functional circuitry and possible rear side adhesive layers are printed. Finally, any front surface decorations or glosses and the front surface adhesive layers are printed. All adhesive layers are covered with release liners for downstream processing. The decorated regions are preferably formed in only the areas of the polymeric film that will be viewable through apertures defined in the metal panel. After suitably forming the desired decoration along the rear of the polymeric film layer, the film is then appropriately shaped or formed. During this forming operation, one or more raised ridges or regions within the film may be produced. An example of a suitable process for forming or shaping the polymeric film in this manner, is by hydroforming or cold forming. Preferably, the film material is sized and shaped, i.e. cut, to fittingly match the shape and configuration of the metal panel, addressed below. After forming the polymeric film in the desired shape and/or configuration, various electrical, optical, and/or mechanical components are then added along the rear face of the film. An apertured, decorated metal panel is then mated to the decorated and electrical component-carrying polymeric film by the adhesive.

More specifically, the preferred embodiment appliance control panels are preferably formed as follows. Currently known techniques are used to form the metal panel. Generally, these may involve cutting or stamping the metal panel having a desired size and/or configuration along with forming any apertures, raised or depressed regions, or other shapes. The metal panel can be formed from large sheets or rolls of stock metal. The panel faces may be subjected to one or more finishing operations, and receive one or more decorative layers or functional coatings. The metal panel can receive one or more decorative images or coatings by a variety of different techniques such as, but not limited to, screen printing, pad printing, digital printing, brushing, resist techniques and the like.

The polymeric film is preferably purchased in bulk having the desired surface treatments and/or functional finishes, such as a hardcoat along its forward face. A wide array of solid, i.e.

opaque, and transparent finishes may be applied onto the rear face of the polymeric film to obtain desired decorative and light transmission properties.

All decorative layers, colors, images, indicia, symbols, text or other visual markings are deposited such as by printing, along the rear face of the polymeric film layer. Decorative inks are available from a number of commercial suppliers such as for example Sun Chemical of Parsippany, N.J. It will be appreciated that the polymeric film layer is preferably transparent or at least substantially so, to thereby enable the decorative layers or images to be viewable along the front face of the polymeric film. A variety of printing techniques can be used, however screen printing is preferred.

The rear face of the decorated polymeric film preferably receives all electrical circuitry and electrical, optical, and/or mechanical components used in the appliance control panel. Preferably, electrically conductive inks are deposited along the rear face of the polymeric film and then dried and/or otherwise cured to form desired electrical circuits and/or electrical traces. Trace inks that cure upon exposure to ultraviolet light are preferred. Electrically conductive inks are commercially available from numerous suppliers such as for example Nazdar of Shawnee, Kans.; Applied Photochemical Inc. of Kimball, Mich.; Acheson Henkel of Madison Heights, Mich.; Conductive Compounds of Hudson, N.H.; and Engineered Conductive Materials of Delaware, Ohio.

The conductive inks can be deposited in a variety of different ways. Screen printing is typically preferred. Preferably, the inks are printed onto the rear face of the polymeric film. Specifically, the inks are printed into capacitive switch circuits under one or more raised user input areas and into power or signal contact circuits around film mounted electronics such as a Duraswitch Thincoder RT. The conductive inks can also be deposited to form film based power/signal tails or circuit traces. The inks and other functional layers are also preferably arranged to produce printed functional devices such as LED displays and microprocessors. This allows the integration of web based screening and/or digital printing for the entire film production & forming process.

As noted, after selective application of the conductive ink upon the decorated rear face of the polymer film, the ink is then cured. Curing can be achieved by a variety of different techniques such as by UV curing. In certain instances, heat curing may also be used so long as the heating operation does not detrimentally affect the decorated polymeric film.

The polymeric films may be formed by using a variety of thermally aided or cold mechanical processes. Hydroforming, cold forming or other similar processes can be used. The critical feature is ensuring that the circuitry design remains functional after forming and the interfaces to the metal panel are pleasing to the end customer. For example, in forming a raised touch switch, a capacitive switch circuit as known in the art is printed onto a rear face of the polymeric film. The capacitive traces must survive typically 40% to 50% elongation during a subsequent forming operation. This typically requires relatively straight walls, i.e. low draft angle, through the thickness of the decorated metal panel and reliable end forms of the various features.

A wide variety of actuators, indicators, lights, switches, e.g. membrane switches and film mounted slider switches, and processors can all be formed or otherwise mounted on the polymeric film layer. Preferably, these components are mounted on the rear face of the film and placed in electrical communication with the traces and circuits. Additional examples of components for forming or mounting upon the polymeric film layer include, but are not limited to printed transistors, integrated OLED's, printed touch screens, active TFT LED displays, and printed film based microprocessors.

As previously noted, the front face of the polymeric film preferably receives a selectively applied layer of a pressure sensitive adhesive. The resulting exposed face of the adhesive is then covered with a release layer. This operation is preferably performed before formation or assembly of the polymeric film layer with the various components and electrical circuitry.

The polymeric film layer containing electronic circuitry, actuators, and/or indicators is then joined to the metal panel. In the event that a release liner has been applied to the adhesive, that liner is then removed. The polymeric film and metal panel are appropriately aligned with one another and exposed face of the adhesive is contacted with the rear face of the metal panel. A sealing force is applied to the resulting assembly whereby the control panel is formed.

In some applications, it may still be preferable to mount a decorated metal electronic control interface directly to a molded plastic structure. In this case, an additional layer of selective pressure sensitive adhesive and associated release layer may be applied as the final rear surface printing layer.

Preferred Control Panels

FIG. 1 illustrates a preferred embodiment control panel assembly 1 in accordance with the present invention. The assembly 1 comprises a metal panel 10 defining a front face 12 and an oppositely directed rear face 14. One or more raised region(s) 13 may be formed in the panel 10 as desired. The panel 10 typically defines one or more slotted apertures 16 and one or more circular apertures 18. It will be appreciated that the metal panel 10 can include a wide variety of aperture styles, shapes, and sizes and is in no way limited to the particular apertures depicted in FIG. 1. As previously explained the metal panel 10 preferably includes one more graphic layer(s) 20 or other text, indicia, coloring or the like along the front face 12 of the panel 10.

The panel assembly 1 also comprises an adhesive layer 30. The adhesive is preferably a pressure sensitive adhesive. The adhesive layer 30 is preferably in the same general size, shape, and configuration as that of the metal panel 10. The adhesive layer defines a front face 32, an oppositely directed rear face 34, and apertures such as slotted apertures 36 and circular apertures 38 shown in FIG. 1. It is preferred that the apertures defined in the adhesive layer 30 are arranged and sized so as to match and be aligned with apertures defined in the metal panel 10. Thus, the slotted apertures 36 should correspond to and be aligned with the slotted apertures 16 defined in the metal panel 10. And, the circular apertures 38 should correspond to and be aligned with the circular apertures 18 defined in the metal panel 10.

The preferred embodiment control panel assembly 1 also comprises a decorated polymeric film layer 50. The decorated polymeric layer 50 preferably has the same general size, shape, and configuration as that of the metal panel 10 but for the noted apertures. However, for certain components mounted on the polymeric film, apertures may be provided extending through the film. The decorated polymeric film 50 defines a front face 52 and an oppositely directed rear face 54. Various decorations such as images, colors, and/or symbols are applied to the rear face 54 of the film to form the decorated film layer 50. As previously explained, these decorative regions will be visible along the front face 52 of the film 50. One or more patterns 60 of conductive ink or other similar compositions are then deposited along the rear face 54 of the polymeric film 50. These patterns as will be appreciated, form electrical circuits upon appropriate drying or curing of the deposited ink. One or more indicator displays 62 and one or more indicator lights 64 such as light emitting diodes (LEDs) can be formed or otherwise mounted on the front face 52 of the polymeric layer 50. The present invention also includes configurations in which indicator displays and/or indicator lights are formed or mounted on the rear face 54 of the polymeric layer 50. In this event, it is generally preferred to provide one or more apertures or other provisions to enable visual contact with the displays and lights. One or more electronic microprocessors 70 can also be provide. In addition, provisions for one or more rotary actuators can be included such as a rotary actuator 80 assembly including a printed set of arcuate traces 80*a* and a corresponding actuator element 80*b*. The actuator 80 includes a control actuator knob 82 and an actuator washer 84. The traces 80*a* are disposed on the rear face 54 of the polymeric film 50. The control panel assembly 1 can also include one or more capacitive switch circuits formed on the rear face 54 of the film 50, which serve as pushbutton actuators 90. The layer 30 of a pressure sensitive adhesive can be deposited on the front face 52 of the polymeric film layer 50 prior to assembly with the metal panel 10.

It will be appreciated that in no way is the present invention limited to the particular control panel assembly illustrated in FIG. 1. Instead, the invention includes a wide array of different combinations of layers, components, and panels.

Figure 2:
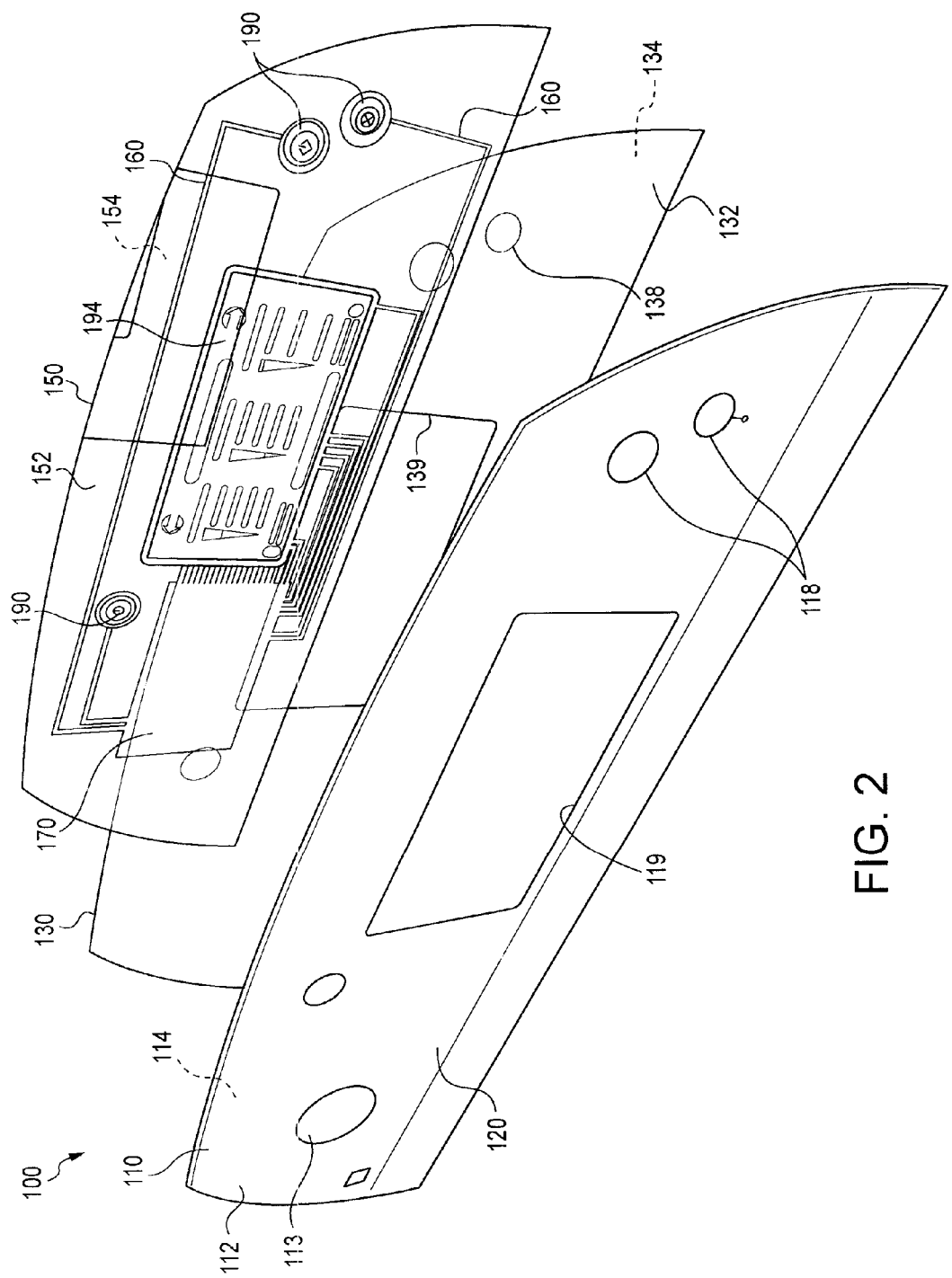
FIG. 2 is an exploded perspective view of another preferred embodiment appliance control panel in accordance with the present invention.

FIG. 2 illustrates another preferred embodiment control panel assembly 100 in accordance with the present invention. The assembly 100 comprises a metal panel 110 defining a front face 112 and an oppositely directed rear face 114. One or more raised region(s) 113 may be formed in the panel 110 as desired. The panel 110 typically defines one or more large apertures 119, and one or more circular apertures 118. It will be appreciated that the metal panel 110 can include a wide variety of aperture styles, shapes, and sizes and is in no way limited to the particular apertures depicted in FIG. 2. As previously explained the metal panel 110 preferably includes one more graphic layer(s) 120 along the front face 112 of the panel 110.

The panel assembly 100 also comprises an adhesive layer 130. The adhesive is preferably a pressure sensitive adhesive. The adhesive layer 130 is preferably in the same general size, shape, and configuration as that of the metal panel 110. The adhesive layer defines a front face 132, an oppositely directed rear face 134, and apertures such as a large aperture 139 and circular apertures 138 shown in FIG. 2. It is preferred that the apertures defined in the adhesive layer 130 be arranged and sized so as to match and be aligned with apertures defines in the metal panel 110. Thus, the large aperture 139 should correspond to and be aligned with the large aperture 119 defined in the metal panel 110. And, the circular apertures 138 should correspond to and be aligned with the circular apertures 118 defined in the metal panel 110.

The preferred embodiment control panel assembly 100 also comprises a decorated polymeric film layer 150. The decorated polymeric layer 150 preferably has the same general size, shape, and configuration as that of the metal panel 110 but for the noted apertures. However, for certain components mounted on the polymeric film, apertures may be provided extending through the polymeric film layer. The polymeric film layer 150 defines a front face 152 and an oppositely directed rear face 154. Various decorations such as images, colors, and/or symbols are applied to the rear face 154 of the film to form the decorated film layer 150. As previously explained, these decorative regions will be visible along the front face 152 of the film 150. One or more patterns 160 of conductive ink or other similar compositions are then deposited along the rear face 154 of the polymeric film 150. These patterns as will be appreciated, form electrical circuits upon appropriate drying or curing of the deposited ink. The control panel assembly 100 can also include one or more capacitive switch circuits formed on the rear face 154 of the film 150, which serve as pushbutton actuators 190. Preferably, the pressure sensitive adhesive layer 130 is deposited along the front face 152 of the polymeric layer 150. The control panel assembly 100 may also include one or more electronic microprocessors 170 and/or illuminated active touch screens 194. The touch screens 194 can be formed directly on a face of the polymeric film layer or one or more corresponding components can be obtained and applied to the polymeric layer. It will be appreciated that the aperture 139 in the adhesive layer 130 and the aperture 119 in the metal panel 110 are sized, shaped, and positioned to allow for viewing of and/or access to the illuminated touch screen 194.

It will be appreciated that in no way is the present invention limited to the particular control panel assembly illustrated in FIG. 2. Instead, the invention includes a wide array of different combinations of layers, components, and panels.

It will be understood that the control panels of the present invention are incorporated into an appliance, and preferably such that the rear face of the polymeric film layer is appropriately enclosed or otherwise covered.

The present invention control panel can be used in conjunction with a variety of appliances and other consumer household devices. Non-limiting examples of such appliances include refrigerators, freezers, clothes washers, clothes dryers, ranges, stoves, thermal ovens, cook tops, microwave ovens, dishwashers, water heaters, trash compactors and air conditioners. It will be appreciated that in no way is the present invention control panel limited to appliances or other household devices. Instead, it is contemplated that the present invention will have significant utility in an array of other applications, systems, and devices.

Many other benefits will no doubt become apparent from future application and development of this technology.

All patents, published applications, and articles noted herein are hereby incorporated by reference in their entirety.

As described hereinabove, the present invention solves many problems associated with previous type devices. However, it will be appreciated that various changes in the details, materials and arrangements of parts, which have been herein described and illustrated in order to explain the nature of the invention, may be made by those skilled in the art without departing from the principle and scope of the invention.

What is claimed is:

1. A control panel assembly comprising:
   a generally planar metal panel defining a front face, an oppositely directed rear face, and at least one aperture;
   a generally transparent polymeric film layer, defining a frontwardly directed face and a rearwardly directed face, the frontwardly directed face being mated to the rear face of the panel; and
   a layer of an adhesive disposed between the rear face of the panel and the frontwardly directed face of the film layer for adhering the frontwardly directed face of the film layer to the rear face of the panel;
   wherein the polymeric film layer includes at least one component disposed thereon, the component selected from the group consisting of an actuator, circuit, indicator, light, switch, processor, and combinations thereof;
   wherein the aperture defined in the metal panel is aligned with the at least one component;

wherein the polymeric film defines at least one circuit and component disposed on the rearwardly directed face;

wherein the metal panel and the adhesive layer define first and second apertures, respectively, the first and second apertures aligned with one another, and the rearwardly directed face of the polymeric film having a decorative layer disposed thereon and visible from the front face of the metal panel through the first and second apertures.

2. The control panel assembly of claim 1 wherein the metal panel includes indicia on the front face.

3. The control panel assembly of claim 1 wherein the adhesive layer defines at least one aperture that is aligned with the at least one component.

4. The control panel assembly of claim 1 wherein the metal panel has a thickness of from about 0.005 inches to about 0.200 inches.

5. The control panel assembly of claim 1 wherein the metal panel is formed from steel or aluminum.

6. The control panel assembly of claim 1 wherein the polymeric film has a thickness of from about 3 mils to about 40 mils.

7. The control panel assembly of claim 1 wherein the polymeric film is formed from a material selected from the group consisting of polyethylene terephthalate, polycarbonate, blends thereof, and combinations thereof.

8. The control panel assembly of claim 1 wherein the polymeric film includes a hard coat layer.

9. The control panel assembly of claim 1 wherein the film layer includes at least one raised region.

10. The control panel assembly of claim 1 wherein the adhesive layer includes a pressure sensitive adhesive.

11. An appliance including the control panel assembly of claim 1.

12. The control panel assembly of claim 1 wherein the control panel does not include a rear support.

13. A control panel assembly consisting essentially of:

a generally planar metal panel defining a front face and an oppositely directed rear face;

a generally transparent polymeric film layer disposed on the rear face of the panel; and a layer of an adhesive disposed between the panel and the film layer for adhering the film layer to the rear face of the panel;

wherein the polymeric film layer includes at least one component disposed thereon, the component selected from the group consisting of an actuator, circuit, indicator, light, switch, processor, and combinations thereof;

wherein the polymeric film defines a rearwardly directed face and the at least one component is disposed thereon;

wherein the metal panel and the adhesive layer define first and second apertures, respectively, the first and second apertures aligned with one another, and the rearwardly directed face of the polymeric film having a decorative layer disposed thereon, wherein the at least one component and the decorative layer are visible from the front face of the metal panel through the first and second apertures.

* * * * *